United States Patent
Murata et al.

(10) Patent No.: US 7,151,675 B2
(45) Date of Patent: Dec. 19, 2006

(54) PRINTED-CIRCUIT BOARD FOR HIGH-SPEED COMMUNICATION

(75) Inventors: Yuichiro Murata, Tokyo (JP); Naoki Nakagawa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 286 days.

(21) Appl. No.: 10/639,464

(22) Filed: Aug. 13, 2003

(65) Prior Publication Data

US 2005/0174747 A1 Aug. 11, 2005

(30) Foreign Application Priority Data

Mar. 7, 2003 (JP) ............... 2003-061818

(51) Int. Cl.
  *H01R 12/16* (2006.01)
(52) U.S. Cl. ............... 361/785; 361/788; 361/803
(58) Field of Classification Search ............... 361/788, 361/803, 778, 785; 356/51, 63; 326/30; 710/303–305
See application file for complete search history.

(56) References Cited

U.S. PATENT DOCUMENTS

| 5,391,922 | A | * | 2/1995 | Matsui ............... 257/773 |
| 5,530,623 | A | * | 6/1996 | Sanwo et al. ............... 361/788 |
| 5,734,208 | A | * | 3/1998 | Jones ............... 307/139 |
| 5,818,253 | A | * | 10/1998 | Takekuma et al. ............... 326/30 |
| 5,821,767 | A | * | 10/1998 | Osaka et al. ............... 326/30 |
| 6,115,278 | A | * | 9/2000 | Deneroff et al. ............... 365/52 |
| 6,219,733 | B1 | | 4/2001 | Appel et al. |
| 6,308,232 | B1 | * | 10/2001 | Gasbarro ............... 710/100 |
| 6,328,572 | B1 | | 12/2001 | Higashida et al. |
| 6,496,380 | B1 | | 12/2002 | Li et al. |
| 6,674,648 | B1 | * | 1/2004 | McCall et al. ............... 361/788 |

* cited by examiner

*Primary Examiner*—Tuan Dinh
(74) *Attorney, Agent, or Firm*—Leydig, Voit & Mayer, Ltd.

(57) ABSTRACT

A multi-pin connector for connecting a signal line on a backboard side and a signal line on a daughter board side has open pins where the signal lines are not connected. In order to prevent transmission loss on the signal lines caused by these open pins, terminating resistances are connected to both ends of the open pins, and ends of the terminating resistances opposite to the open pins are connected to ground or to a power supply.

7 Claims, 7 Drawing Sheets

CONVENTIONAL ART

PRINTED-CIRCUIT BOARD FOR HIGH-SPEED COMMUNICATION

BACKGROUND OF THE INVENTION

1. Field of the Invention

The present invention relates to a printed-circuit board for high-speed communication in which open pins of a multi-pin connector are terminated in order to eliminate influence of the open pins.

2. Description of the Related Art

In connecting many signal lines between printed circuit boards, a multi-pin connector is packaged in the printed circuit boards, and the signal lines are connected through the connector. This kind of device is disclosed in, for example, Japanese Patent Publication (unexamined) No. 2001-42981 (pages 3 to 5, FIG. 4). In a case where the number of the connector pins is larger than the number of the signal lines in the printed circuit boards, some of the connector pins are left as open pins where the signal lines are not connected. Hitherto, these open pins are left open or connected to the ground.

FIG. 13 is a graph showing a transmission characteristic of a signal line of a conventional printed-circuit board, and is a graph showing a transmission characteristic of a differential signal line connected to a connector pin.

FIG. 13 shows that transmission loss is small and signals are transmitted favorably in a low-frequency range. In a high-frequency range, the transmission loss increases at certain frequencies, and it is not possible to transmit signals in this frequency band. The transmission loss increases at frequencies higher than 3 GHz, and spike transmission loss is generated in this frequency band. Hitherto, the transmission characteristic at such a high frequency has not been examined, and the phenomenon of generation of spike transmission loss and the fact that the transmission loss is caused by the open pins connected to ground has not been known. The mechanism of this transmission loss is explained below. Both ends of each open pin are connected to the ground; therefore the connector pin operates as a resonator when the connector pin has a length that is an integer multiple of a half-wavelength of the signal. The connector pins are normally approximately 20 mm in length, and the resonance frequency is approximately 3 GHz in consideration of the relative dielectric constant of the materials such as plastic, supporting the connector pins. The open pins are joined to the signal pins connected to the signal lines; therefore energy of the signals flowing through the signal pins is absorbed by the open pins at the resonance frequency, and the transmission loss of the signal lines increases. Even if the open pins are left open, the transmission loss is increased by the same mechanism when the connector pins resonate.

Japanese Patent Publication (unexamined) No. 2001-42981 discloses an example where a connector composing a final stage of a signal line is provided with a termination board where a terminating resistance is packaged in order to reduce noises reflected from the final stage of the signal line. However, this construction has a problem that it is not possible to eliminate the influence of the open pins and prevent generation of spike transmission loss in the high-frequency band higher than 3 GHz.

SUMMARY OF THE INVENTION

The present invention was made to solve the above-discussed problems and has an object of obtaining a printed-circuit board for high-speed communication in which the influence of the open pins of the multi-pin connector is eliminated.

A printed-circuit board for high-speed communication according to the invention includes a first printed-circuit board having a first signal line for transmitting high-frequency signals, a second printed-circuit board having a second signal line that is connected to the first signal line of the foregoing first printed-circuit board and transmits high-frequency signals, and a connector provided with many pins and arranged between the first printed-circuit board and the second printed-circuit board so that the first signal line and the second signal line are connected by the pins, and elements for giving loss are connected to open pins where the first signal line and the second signal line of the connector are not connected.

According to the invention constructed as described above, it is possible to reduce generation of transmission loss of the signal lines.

DESCRIPTION OF THE PREFERRED EMBODIMENTS

Embodiment 1

Figure 1:
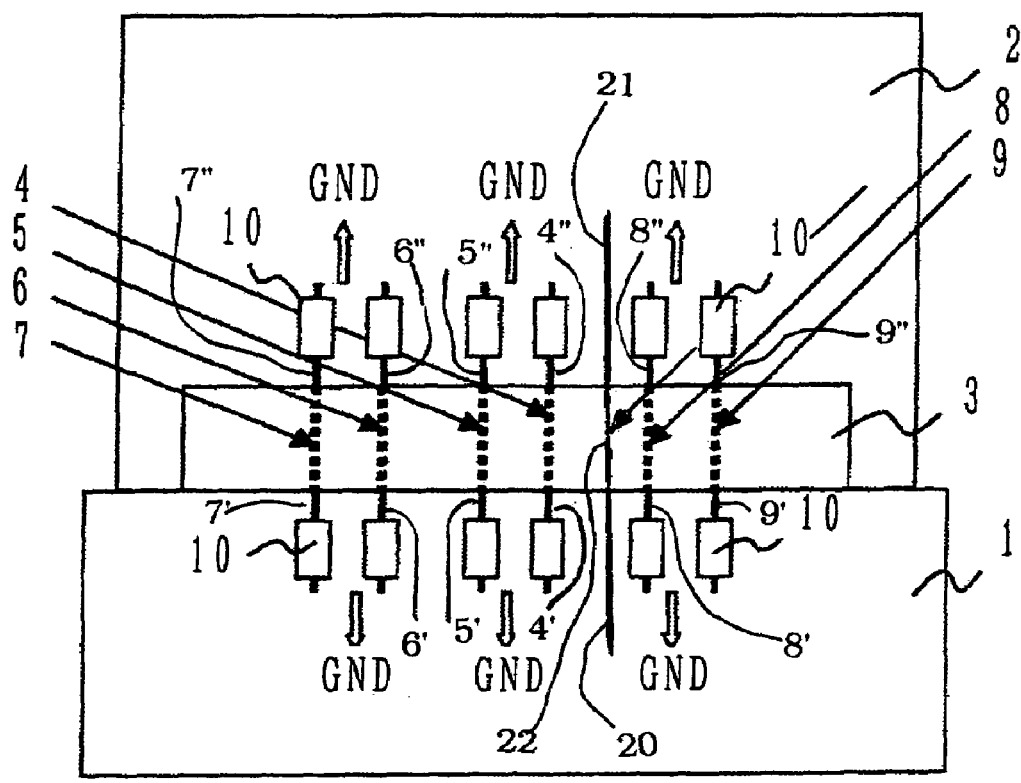
FIG. 1 is a diagram showing a printed-circuit board for high-speed communication according to Embodiment 1 of the invention.

FIG. 1 is a diagram showing a printed-circuit board for high-speed communication according to Embodiment 1 of the invention. Signal pins where signal lines are connected are not show in FIG. 1.

In FIG. 1, a signal line 20 (a first signal line) of a backboard 1 (a first printed-circuit board) and a signal line 21 (a second signal line) of a daughter board 2 (a second printed-circuit board) are connected by a connector pin 22 of a connector 3. The connector 3 has connector pins 4 to 9 that are open. Terminating resistances 10 are arranged on both sides of and respectively connected by conducting lines 4' to 9" to each of these connector pins 4 to 9, and the other side of each terminating resistance is connected to the ground of the printed-circuit board. It is also preferable that the other side of each terminating resistance is connected to a power supply.

Figure 2:
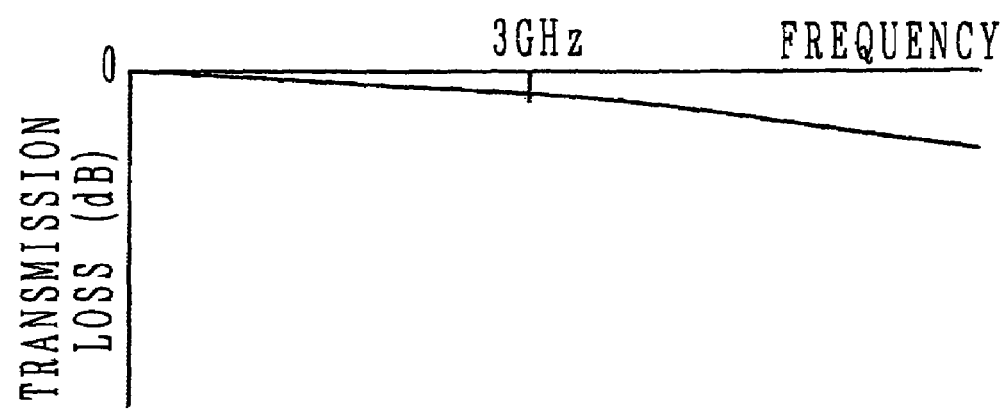
FIG. 2 is a graph showing a transmission characteristic of a signal line of the printed-circuit board for high-speed communication according to Embodiment 1 of the invention.

FIG. 2 is a graph showing a transmission characteristic of the signal line of the printed-circuit board for high-speed communication according to Embodiment 1 of the invention.

FIG. 2 shows transmission loss to the frequency, and spike transmission loss is not generated in the transmission characteristic of the signal lines.

As shown in FIG. 1, Embodiment 1 is aimed to reduce a resonance characteristic of the open pins and reduce generation of spike transmission loss in the signal lines by arranging the terminating resistances 10 at both ends of each open pin. It is not necessary that the value of the terminating resistances 10 coincides with characteristic impedance of the signal lines provided that appropriate loss is given to the open pins and the resonance characteristic of the open pins is lowered when the terminating resistances 10 are at the value.

According to Embodiment 1, generation of transmission loss of the signal lines is reduced by arranging the terminating resistances at both ends of each open pin.

Embodiment 2

Figure 3:
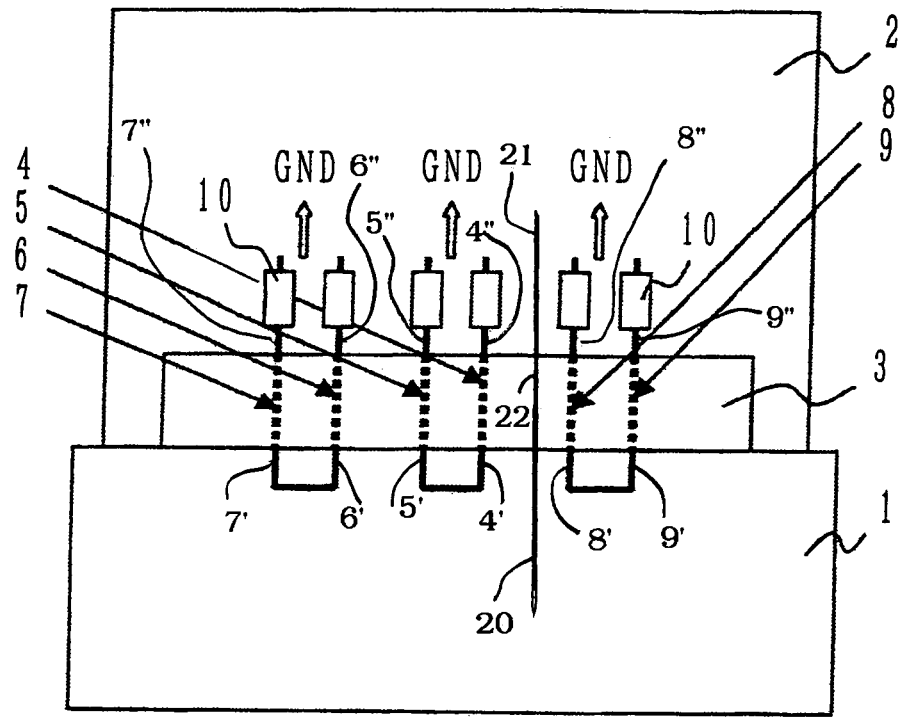
FIG. 3 is a diagram showing a printed-circuit board for high-speed communication according to Embodiment 2 of the invention.

FIG. 3 is a diagram showing a printed-circuit board for high-speed communication according to Embodiment 2 of the invention.

In FIG. 3, reference numerals 1 to 10 and 20–22 are the same with those in FIG. 1. In FIG. 3, the open pins are connected to each other on the backboard 1 side, the terminating resistances 10 are arranged on the daughter board 2 side, and the other side of each terminating resistance 10 is connected to the ground of the printed-circuit board. It is also preferable that the other side of each terminating resistance is connected to the power supply.

According to the construction as described above, spike transmission loss is not generated in the transmission characteristic of the signal lines. Moreover, according to this construction, it is not necessary to arrange the terminating resistances 10 on the backboard 1, and this has the effect of reducing the number of parts packaged in the backboard 1 and facilitating assembling of the backboard 1. The combinations of the open pins connected to each other on the backboard 1 can be arranged in any way.

Embodiment 2 has the effect of preventing generation of spike transmission loss in the transmission characteristic of the signal lines.

Moreover, it is not necessary to arrange the terminating resistances on the backboard side, and this has the effect of reducing the number of parts packaged in the backboard and facilitating assembling the parts in the printed-circuit board.

Embodiment 3

Figure 4:
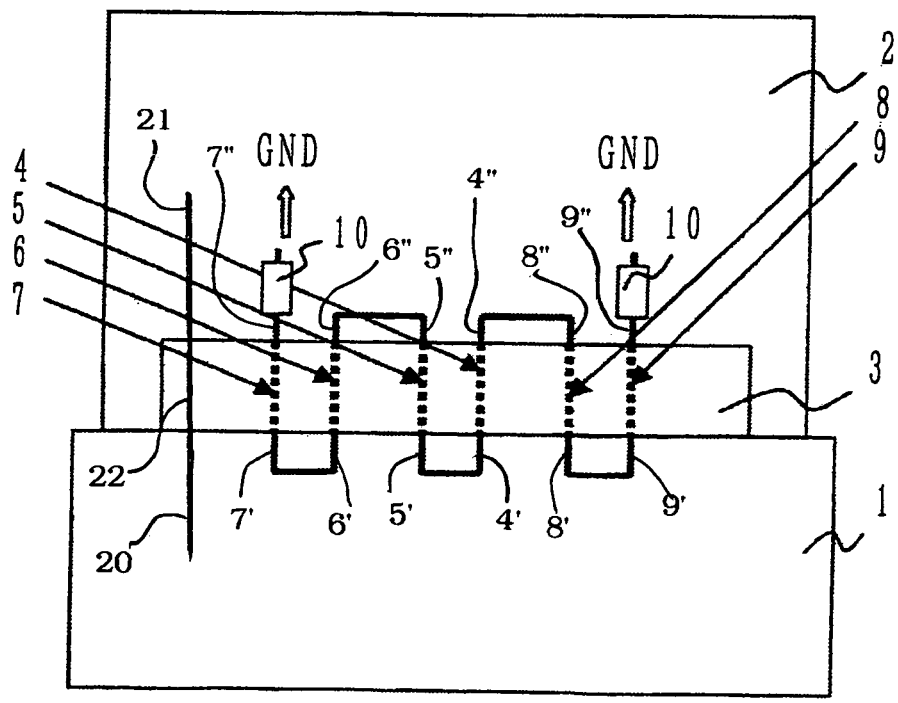
FIG. 4 is a diagram showing a printed-circuit board for high-speed communication according to Embodiment 3 of the invention.

FIG. 4 is a diagram showing a printed-circuit board for high-speed communication according to Embodiment 3 of the invention.

In FIG. 4, reference numerals 1 to 10 and 20–22 are the same with those in FIG. 1. In FIG. 4, the open pins of the connector 3 are connected in a daisy chain connection, and only two terminating resistances 10 are arranged at both ends of the daisy chain connection on the daughter board 2 side in this construction. While the other side of each terminating resistance 10 is connected to the ground in FIG. 4, it is also preferable that the other side of each terminating resistance is connected to the power supply. According to the construction as described above, it is possible to sharply reduce the number of the terminating resistances 10 and prevent generation of spike transmission loss.

Embodiment 3 has the effect of sharply reducing the number of the terminating resistances and preventing generation of spike transmission loss.

Embodiment 4

Figure 5:
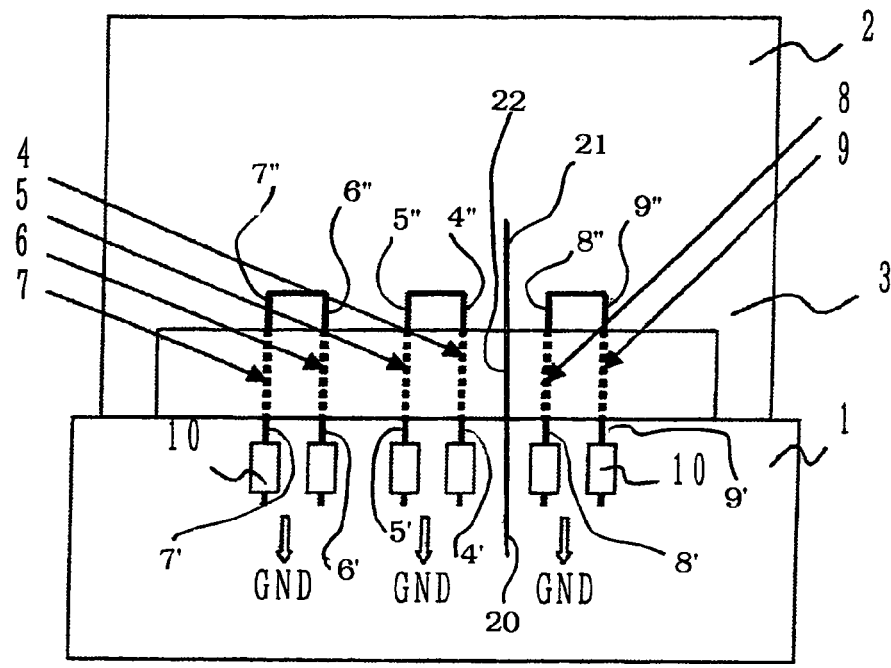
FIG. 5 is a diagram showing a printed-circuit board for high-speed communication according to Embodiment 4 of the invention.

FIG. 5 is a diagram showing a printed-circuit board for high-speed communication according to Embodiment 4 of the invention.

In FIG. 5, reference numerals 1 to 10 and 20–22 are the same with those in FIG. 1. In FIG. 5, the open pins are connected to each other on the daughter board 2 side, the terminating resistances 10 are arranged on the backboard 1 side, and the other side of each terminating resistance 10 is connected to the ground of the printed-circuit board. It is also preferable that the other side of each terminating resistance is connected to the power supply.

According to the construction as described above, spike transmission loss is not generated in the transmission characteristic of the signal lines. Moreover, according to this construction, it is not necessary to arrange the terminating resistances 10 on the daughter board 2, and this has the effect of reducing the number of parts packaged in the daughter board 2 and facilitating assembling of the daughter board 2. The combinations of the open pins connected to each other on the daughter board 2 can be arranged in any way.

According to Embodiment 4, the open pins are connected to each other on the daughter board side, and the terminating resistances are arranged on the backboard side, and as a result, it is possible to reduce the number of the terminating resistances and also reduce generation of transmission loss of the signal lines.

Embodiment 5

Figure 6:
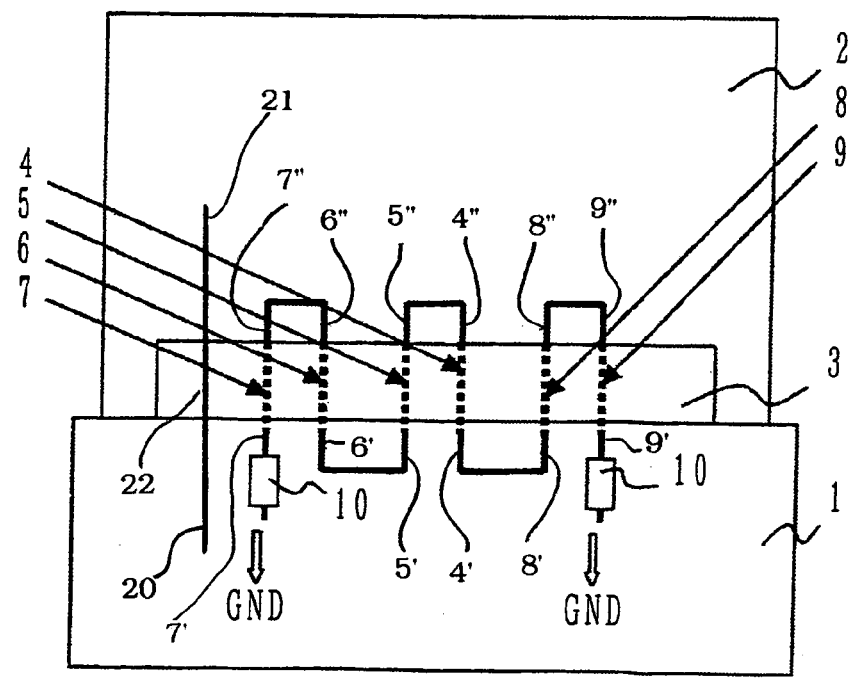
FIG. 6 is a diagram showing a printed-circuit board for high-speed communication according to Embodiment 5 of the invention.

FIG. 6 is a diagram showing a printed-circuit board for high-speed communication according to Embodiment 5 of the invention.

In FIG. 6, reference numerals 1 to 10 and 20–22 are the same with those in FIG. 1. In FIG. 6, the open pins of the connector 3 are connected in a daisy chain connection, and only two terminating resistances 10 are arranged at both ends of the daisy chain connection on the backboard 1 side in this construction. While the other side of each terminating resistance 10 is connected to the ground in FIG. 6, it is also preferable that the other side of each terminating resistance 10 is connected to the power supply. According to the construction as described above, it is possible to sharply reduce the number of the terminating resistances 10 and prevent generation of spike transmission loss.

According to Embodiment 5, the open pins are connected in a daisy chain connection, and two terminating resistances are arranged on the backboard 2 side, and as a result, it is possible to sharply reduce the number of the terminating resistances and also reduce generation of transmission loss of the signal lines.

Embodiment 6

Figure 7:
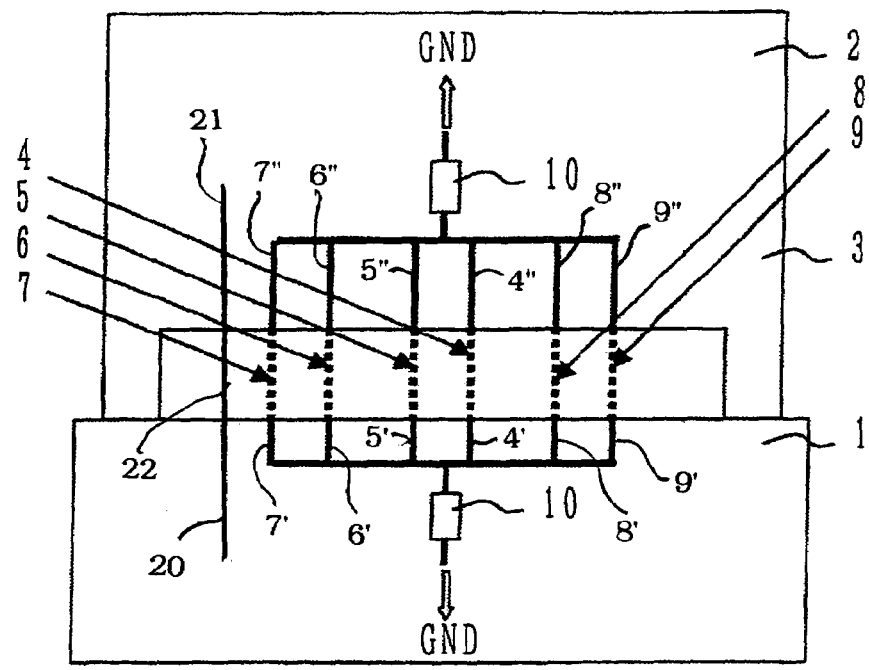
FIG. 7 is a diagram showing a printed-circuit board for high-speed communication according to Embodiment 6 of the invention.

FIG. 7 is a diagram showing a printed-circuit board for high-speed communication according to Embodiment 6 of the invention.

In FIG. 7, reference numerals 1 to 10 and 20–22 are the same with those in FIG. 1. In FIG. 7, the open pins of the connector 3 are connected in parallel, and terminating resistances are arranged on both sides of the parallel connection in this construction. While the other side of each terminating resistance 10 is connected to the ground in FIG. 7, it is also preferable that the other side of each terminating resistance 10 is connected to the power supply. According to the construction as described above, it is possible to sharply reduce the number of the terminating resistances 10 and prevent generation of spike transmission loss.

According to Embodiment 6, the open pins are connected in parallel, and two terminating resistances are arranged on the backboard side and the daughter board side, and as a result, it is possible to sharply reduce the number of the terminating resistances and also reduce generation of transmission loss of the signal transmission lines.

Embodiment 7

Figure 8:
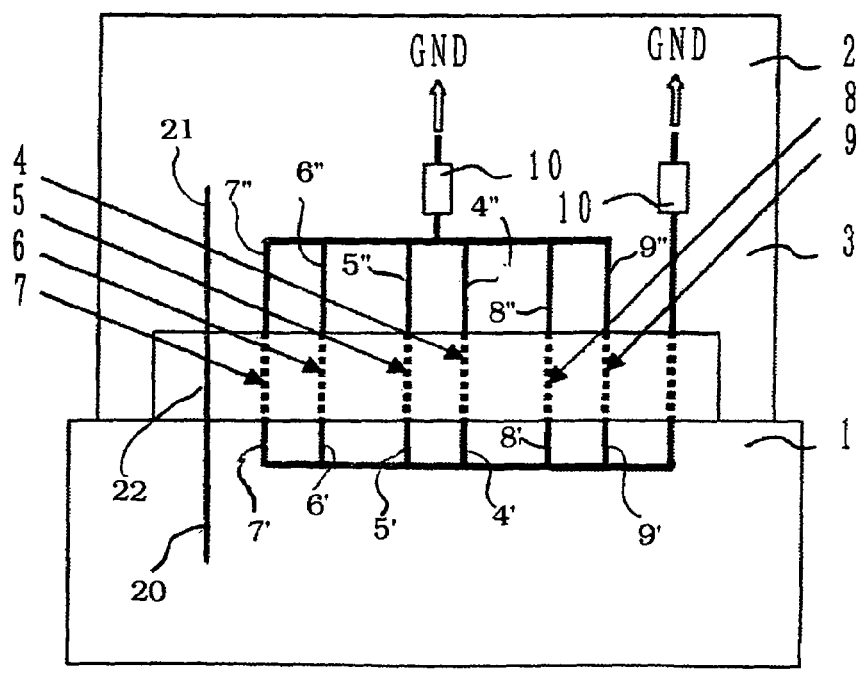
FIG. 8 is a diagram showing a printed-circuit board for high-speed communication according to Embodiment 7 of the invention.

FIG. 8 is a diagram showing a printed-circuit board for high-speed communication according to Embodiment 7 of the invention.

In FIG. 8, reference numerals 1 to 10 and 20–22 are the same with those in FIG. 1. In FIG. 8, the open pins of the connector 3 are connected in parallel, one side of the parallel connection is folded back to the daughter board side, and the terminating resistances are arranged only on the daughter board side in this construction. While the other side of each terminating resistance 10 is connected to the ground in FIG. 8, it is also preferable that the other side of each terminating resistance 10 is connected to the power supply. According to the construction as described above, it is possible to sharply reduce the number of the terminating resistances 10 and prevent generation of spike transmission loss.

According to Embodiment 7, the open pins are connected in parallel, and two terminating resistances are arranged on the daughter board side, and as a result, it is possible to sharply reduce the number of the terminating resistances and also reduce generation of transmission loss of the signal transmission lines.

Embodiment 8

Figure 9:
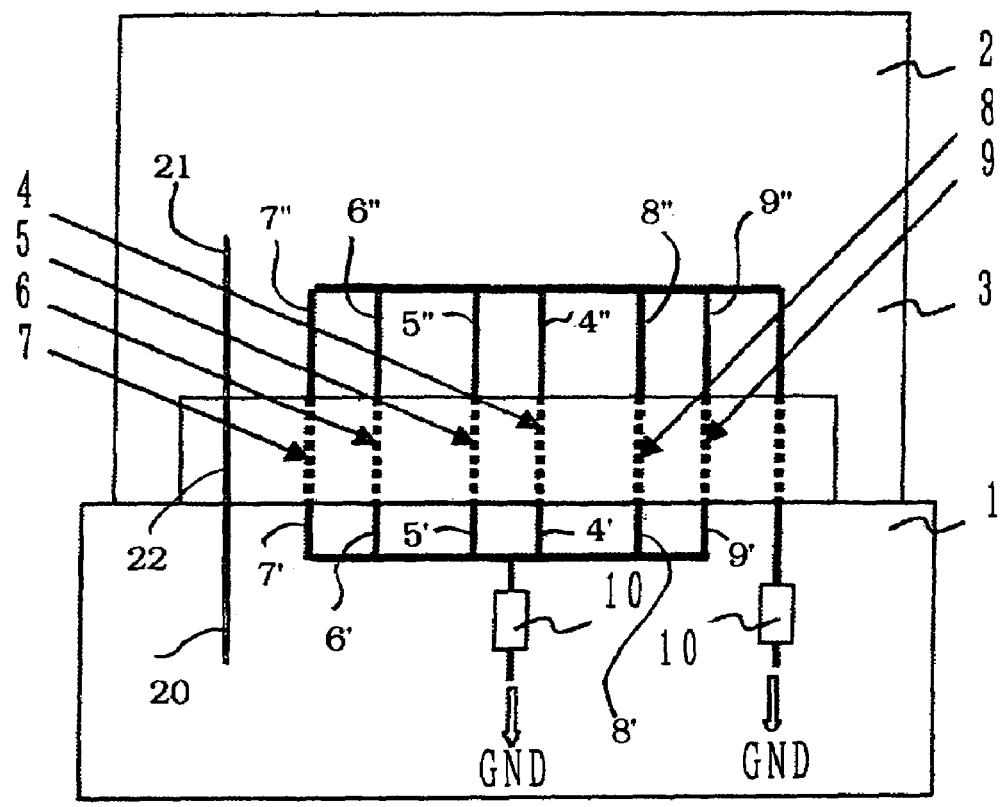
FIG. 9 is a diagram showing a printed-circuit board for high-speed communication according to Embodiment 8 of the invention.

FIG. 9 is a diagram showing a printed-circuit board for high-speed communication according to Embodiment 8 of the invention.

In FIG. 9, reference numerals 1 to 10 and 20–22 are the same with those in FIG. 1. In FIG. 9, the open pins of the connector 3 are connected in parallel, one side of the parallel connection is folded back to the backboard side, and the terminating resistances are arranged only on the backboard side. While the other side of each terminating resistance 10 is connected to the ground in FIG. 9, it is also preferable that the other side of each terminating resistance 10 is connected to the power supply. According to the construction as described above, it is possible to sharply reduce the number of the terminating resistances 10 and also prevent generation of spike transmission loss.

According to Embodiment 8, the open pins are connected in parallel, and two terminating resistances are arranged on the backboard side, and as a result, it is possible to sharply reduce the number of the terminating resistances and also reduce generation of transmission loss of the signal transmission lines.

Embodiment 9

Figure 10:
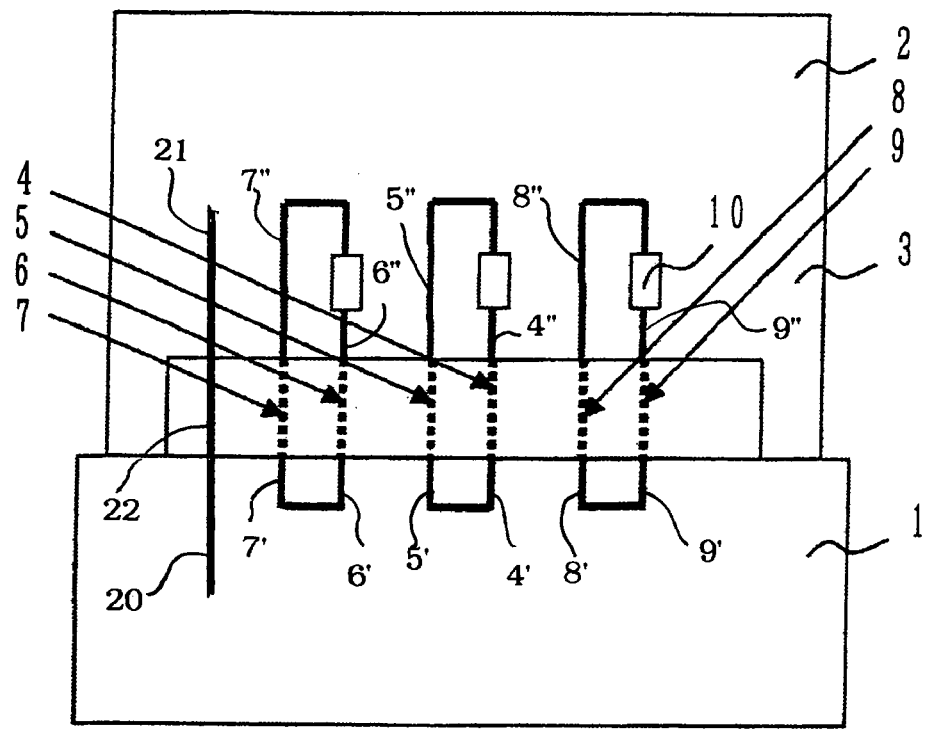
FIG. 10 is a diagram showing a printed-circuit board for high-speed communication according to Embodiment 9 of the invention.

FIG. 10 is a diagram showing a printed-circuit board for high-speed communication according to Embodiment 9 of the invention.

In FIG. 10, reference numerals 1 to 10 and 20–22 are the same with those in FIG. 1. In FIG. 10, the open pins are connected to each other on the backboard 1 side and on the daughter board 2 side, and the terminating resistances are arranged on the lines each connecting one open pin with another. While FIG. 10 shows an example where the terminating resistances are arranged on the lines on the daughter board side, it is also preferable that the terminating resistances are arranged on the backboard side or on both of the daughter board side and the backboard side. According to the construction as described above, it is possible to prevent generation of spike transmission loss without connecting the open pins to the power supply or the ground.

According to Embodiment 9, the open pins are connected to each other, and the terminating resistances are arranged on the lines connecting the open pins, and as a result, it is possible to reduce generation of transmission loss of the signal transmission lines without connecting the open pins to the power supply or the ground.

Embodiment 10

While the backboard 1 (the first printed-circuit board) and the daughter board 2 (the second printed-circuit board) are used in the examples shown in Embodiments 1 to 9, it is also preferable to apply the invention to a device in which plural daughter boards (plural printed-circuit boards) are connected through connectors.

Figure 11:
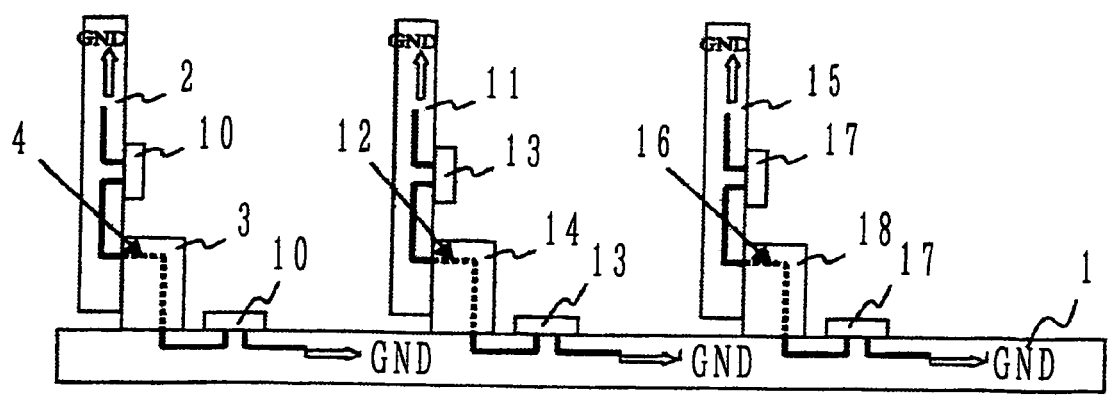
FIG. 11 is a diagram showing a printed-circuit board for high-speed communication according to Embodiment 10 of the invention.

FIG. 11 shows an example where three daughter boards are used in a printed-circuit board for high-speed communication.

In FIG. 11, numerals 2, 11, and 15 are daughter boards, numerals 3, 14, and 18 are connectors, numerals 4, 12, and 16 are connector open pins, and numerals 10, 13, and 17 are terminating resistances.

The terminating resistances 10 are arranged at both ends of the open pin 4 of the connector 3, and the other side of each terminating resistance is connected to the ground of the printed-circuit board or the power supply. In the same way, the terminating resistances 13 are arranged at both ends of the open pin 12 of the connector 14, and the other side of each terminating resistance is connected to the ground of the printed-circuit board or the power supply. The terminating resistances 17 are arranged at both ends of the open pin 16 of the connector 18, and the other side of each terminating resistance is connected to the ground of the printed-circuit board or the power supply. According to the construction as described above, it is possible to prevent generation of spike transmission loss in the transmission characteristic of the signal lines in all the daughter boards.

While FIG. 11 shows an example where the open pins are terminated individually, it is also preferable that plural open pins are connected in a daisy chain connection or connected in parallel.

According to Embodiment 10, the terminating resistances are arranged on the open pins of the plural connectors connected to the backboard, and as a result, it is possible to prevent generation of spike transmission loss in the transmission characteristic of all the signal lines.

Embodiment 11

While Embodiment 10 shows an example where the open pins of the connectors of the plural daughter boards are individually provided with the terminating resistances, it is also preferable to collectively terminate the open pins of the plural connectors.

Figure 12:
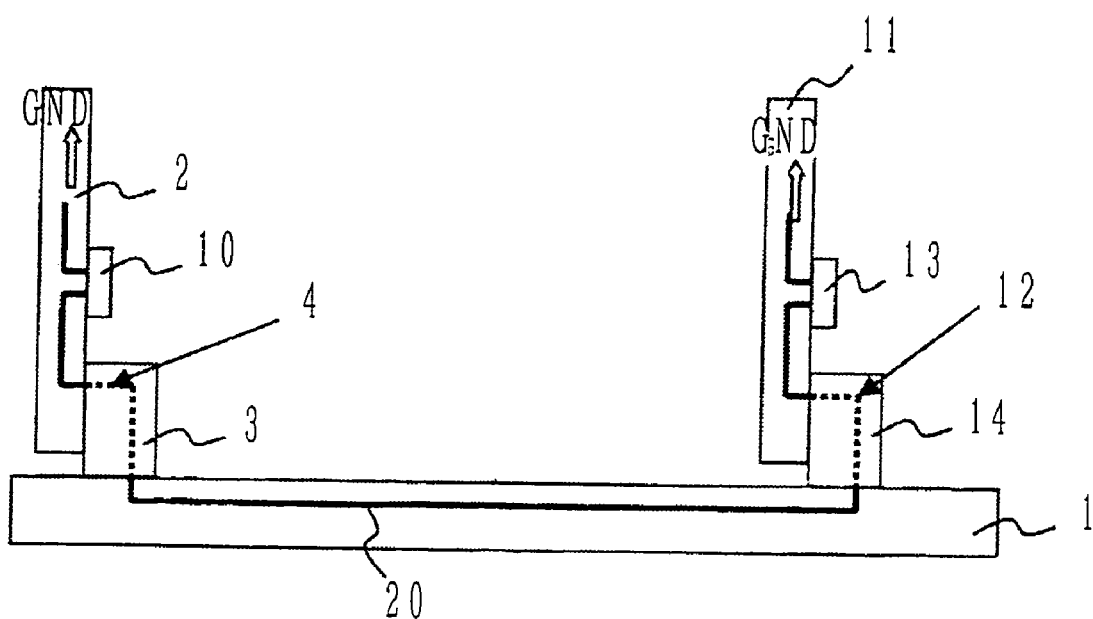
FIG. 12 is a diagram showing a printed-circuit board for high-speed communication according to Embodiment 11 of the invention.
Figure 13:
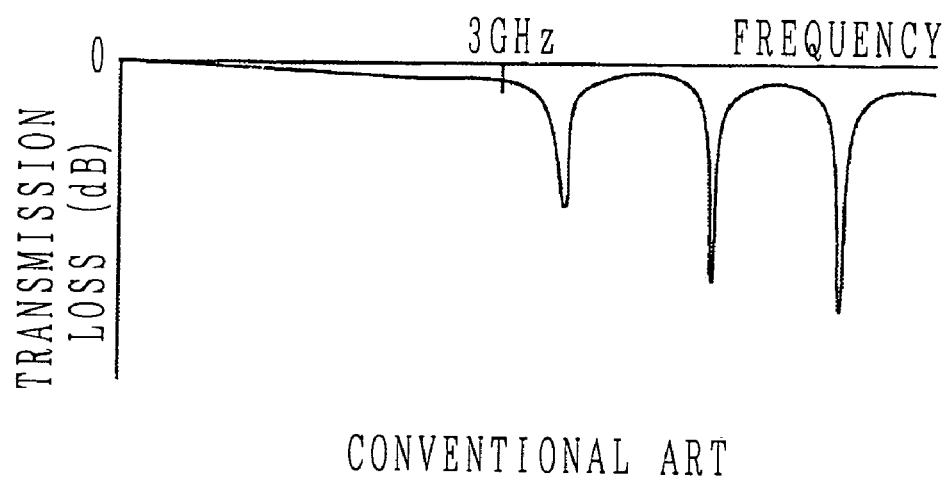
FIG. 13 is a graph showing a transmission characteristic of a signal line of a conventional printed-circuit board.

FIG. 12 is a diagram showing a printed-circuit board for high-speed communication according to Embodiment 11 of the invention.

In FIG. 12, reference numerals 1 to 18 are the same with those in FIG. 11. Numeral 20 is a line in the backboard. The open pin 4 of the connector 3 is provided with the terminating resistance 10, and the other side of the terminating resistance 10 is connected to the ground or the power supply. The other side of the open pin of the connector 3 is connected to the open pin 12 of the connector 14 arranged on the daughter board 11 through the line 20 in the backboard. The other side of the open pin 12 is connected to the ground or the power supply through the terminating resistance 13. According to the construction as described above, it is possible to sharply reduce the number of the terminating resistances and prevent generation of spike transmission loss.

While FIG. 12 shows an example where the open pins are terminated individually, it is also preferable that plural open pins are connected in a daisy chain connection or connected in parallel.

According to Embodiment 11, the open pins of the two connectors are connected, and the terminating resistances are arranged at both ends of the open pins, and as a result, it is possible to reduce generation of spike transmission loss of the signal transmission lines.

Embodiment 12

While the other side of each terminating resistance is connected to the ground or the power supply in Embodiments 1 to 11, the same advantages are obtained in a case where the other side of each terminating resistance is open. According to the construction described above, it is possible to prevent generation of spike transmission loss.

According to Embodiment 12, it is possible to prevent generation of spike transmission loss without arranging a wiring pattern on the other side of the terminating resistance.

Embodiment 13

The terminating resistance is connected to the open pin of the connector in the examples described in Embodiments 1 to 12. The terminating resistance is composed of a normal resistance part, a resistance built in a board, a printed resistance, a high-resistance line, a relatively long line, or the like. The same advantages are obtained by arranging a condenser element or an inductance element. In other words, the open pin of the connector is not directly connected to the ground or the power supply but is connected to an element for giving some loss, and this makes it possible to prevent generation of spike transmission loss.

The element for giving loss is, for example, directly connected to the open pin of the connector or connected through a line, a via, or a through hole.

According to Embodiment 13, generation of spike transmission loss is prevented in a relatively wide frequency range.

Embodiment 14

While the terminating resistances are connected to all the open pins of the connector in the examples described in Embodiments 1 to 13, the same advantages are obtained by arranging the terminating resistances on a part of the open pins of the connector. The open pins near the signal lines exert a bad influence upon the transmission characteristic of the signal lines, therefore it is possible to prevent generation of spike transmission loss by arranging the terminating resistances on the open pins near the signal lines.

According to Embodiment 14, it is possible to prevent generation of spike transmission loss by arranging terminating resistances on not all the open pins.

Embodiment 15

While methods for terminating the open pins are disclosed in Embodiment 1 to 14, it is also preferable to mix these methods for terminating the open pins.

What is claimed is:

1. A printed-circuit board assembly for high-speed communication comprising:

a connector including a plurality of pins for respectively connecting conductors on a first printed-circuit board to corresponding conductors on a second printed-circuit board when the first and second printed-circuit boards are connected to the connector;

a first printed-circuit board connected to the connector and including a plurality of conductors, the plurality of conductors including a first signal line for transmitting a high frequency signal and a plurality of lines connected to respective open pins of the connector but not connected to any signal line;

a second printed-circuit board connected to the connector and including a first signal line connected to the first signal line of the first printed-circuit board, through a pin of the connector, for transmitting high frequency signals between the first and second printed-circuit boards, and a plurality of lines respectively connected to the open pins of the connector but not being connected to any signal lines; and lossy elements on at least one of the first and second printed-circuit boards and connected to respective open pins of the connector by respective lines.

2. The printed-circuit board assembly according to claim 1 wherein the lossy elements are present on each of the first and second printed-circuit boards, have respective first ends connected to respective open pins of the connector by respective lines, and second ends that are electrically open or are connected to ground or to a power supply.

3. The printed-circuit board assembly according to claim 1 wherein
the lossy elements are present on the first printed-circuit board and have first ends connected to respective open pins of the connector by respective lines and second ends that are electrically open or are connected to ground or to a power supply, and
pairs of the lines on the second printed-circuit board are electrically connected together.

4. The circuit board assembly according to claim 1 wherein
pairs of the lines on the first printed-circuit board and on the second printed-circuit board that are connected to open pins of the connector are connected together electrically so that the lines on the first and second printed-circuit boards are connected in series through respective open pins of the connector, and
the lossy elements are present on the first printed-circuit board and have respective first ends connected to electrically opposite ends of the lines on the first and second printed-circuit boards that are connected in series and respective second ends that are electrically open or are connected to the ground or to a power supply.

5. The printed-circuit board assembly according to claim 1 wherein the lines on the first printed-circuit board that are connected to open pins of the connector are electrically connected in parallel and to a first end of a first lossy element on the first printed-circuit board, the lines on the second printed-circuit board that are connected to open pins of the connector are electrically connected in parallel and to a first end of a second lossy element on the second printed-circuit board, and the first and second lossy elements have respective second ends that are electrically open or are connected to ground or to a power supply.

6. The printed-circuit board assembly according to claim 1 wherein the lines on the first printed-circuit board that are connected to open pins of the connector are electrically connected in parallel and to a first end of a first lossy element on the first printed-circuit board, the lines on the second printed-circuit board that are connected to open pins of the connector are electrically connected in parallel and to a first end of a second lossy element on the first printed-circuit board, and the first and second lossy elements have respective second ends that are electrically open or are connected to ground or to a power supply.

7. The printed-circuit board for high-speed communication according to claim 1, wherein said the lossy elements are selected from the group consisting of a resistance part, a resistance built in a board, a printed resistance, a high-resistance line, a long line, a condenser element, and an inductance element.

* * * * *